(12) United States Patent
Yoshida et al.

(10) Patent No.: US 6,255,201 B1
(45) Date of Patent: Jul. 3, 2001

(54) METHOD AND DEVICE FOR ACTIVATING SEMICONDUCTOR IMPURITIES

(75) Inventors: Akihisa Yoshida, Kyoto; Masatoshi Kitagawa, Hirakata; Masao Uchida, Ibaraki; Makoto Kitabatake, Nara; Tsuneo Mitsuyu, Hirakata, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/341,464

(22) PCT Filed: Nov. 30, 1998

(86) PCT No.: PCT/JP98/05383

§ 371 Date: Jul. 12, 1999

§ 102(e) Date: Jul. 12, 1999

(87) PCT Pub. No.: WO99/28960

PCT Pub. Date: Jun. 10, 1999

(30) Foreign Application Priority Data

Nov. 28, 1997 (JP) .................................................. 9-327771

(51) Int. Cl.$^7$ ................................................ H01L 21/42
(52) U.S. Cl. ........................................ 438/535; 438/530
(58) Field of Search ....................................... 438/530–535

(56) References Cited

U.S. PATENT DOCUMENTS

| Re. 33,274 | * | 7/1990 | Burham et al. . | |
| 3,792,379 | * | 2/1974 | Auston et al. . | |
| 4,379,727 | | 4/1983 | Hansen et al. . | |
| 4,438,245 | * | 3/1984 | Wu | 148/1.5 |
| 5,345,330 | * | 9/1994 | Ckamoto et al. | 359/326 |
| 5,627,084 | | 5/1997 | Yamazaki et al. | 437/21 |
| 5,930,591 | * | 7/1999 | Huang | 438/36 |
| 5,993,538 | * | 11/1999 | Asakawa et al. | 117/8 |

FOREIGN PATENT DOCUMENTS

| 7-22311 | 1/1995 | (JP) . |
| 8-148443 | 6/1996 | (JP) . |

OTHER PUBLICATIONS

T. Kimoto et al., Journal of Electronic Materials, vol. 25, No. 5, 1996, pp. 879–884, "Aluminum and Boron Ion Implantations into 6H–SiC Epilayers".

Y. Morita et al., Japanese Journal of Applied Physics, vol. 28, No. 2, Feb. 1989, pp. L309–L311, "UV Pulsed Laser Annealing of Si Implanted Silicon Film and Low–Temperature Super–Thin Film Transistors".

* cited by examiner

Primary Examiner—Long Pham
(74) Attorney, Agent, or Firm—Parkhurst & Wendel, L.L.P

(57) ABSTRACT

An impurity doped SiC substrate 1 and SiC thin film 2 are irradiated with a laser light 5 having a wavelength longer than such a wavelength that a band edge absorption of a semiconductor is caused. The wavelength of the laser light 5 may be such a wavelength that an absorption is caused by a vibration by the bond of an impurity element and an element constituting the semiconductor, for example, a wavelength of 9 $\mu$m to 11 $\mu$m. Specifically, in the case where Al is doped in SiC, the wavelength of the laser light 5 may be within the range of 9.5 $\mu$m to 10 $\mu$m.

11 Claims, 7 Drawing Sheets

METHOD AND DEVICE FOR ACTIVATING SEMICONDUCTOR IMPURITIES

TECHNICAL FIELD

The present invention relates to a method and an apparatus for activating a semiconductor impurity implanted in silicon carbide (SiC) and the like, for example, such a method and apparatus required in manufacturing semiconductor devices.

BACKGROUND ART

In a production of semiconductor devices utilizing silicon (Si), which is the most popular semiconductor material at present, generally, after adding an impurity in Si by an ion implantation and the like method, the Si is heated to 900° C. to 1100° C. with the use of an electrical furnace, a flash lamp annealer, and the like, to activate the impurity in the Si.

In recent years, a semiconductor device utilizing silicon carbide (SiC) has drawn considerable attention in the industry since such a device is excellent in electric power characteristics (high breakdown voltage and high current-carrying capacity), high-frequency characteristics, and resistance in an environment of use. However, the ion implantation and activation of SiC involve many difficulties in comparison with those of Si. In order to overcome such difficulties, several techniques in the impurity activation have been suggested. An example of such techniques is that an impurity is added when forming an SiC film, an ion implantation is carried out under a high temperature of about 500° C. to 1000° C., and thereafter, as disclosed in T. Kimoto, et al., *Journal of Electronic Materials,* Vol. 25, No. 5, (1996) pp. 879–884 etc., an impurity is activated by a heat treatment at a high temperature of 1400° C. to 1600° C.

However, such methods of impurity activation by a heat treatment requires a step of heating Si and the like semiconductor material with the use of electrical furnace and the like. Consequently, a relatively long time is necessary for the activation, and therefore it is rendered difficult to increase the productivity. Such drawbacks become more conspicuous in the case of using SiC since a further higher temperature is required in the heat treatment. Moreover, in the case of SiC, regarding a p-type dopant, it is difficult to form a semiconductor layer in which the p-type dopant element is activated to a high degree.

In view of such drawbacks, for example, Japanese Unexamined Patent Publication No. 7-022311 discloses such a method of an impurity activation as described in the following. According to this, a laser annealing is conducted by irradiating with a laser light an amorphous Si film in which concentrations of carbon, nitrogen, and oxygen are made to be lower than certain values, in order to form a mixed region in which an amorphous region and a solid-phase ordered region are present together without fusing the amorphous Si film. Then, impurity ions are implanted into the amorphous Si film, and thereafter laser annealing is carried out by irradiating the Si film with a laser light having a wavelength of 248 nm to make an impurity region to be a semi-amorphous state. However, although it is disclosed in the Publication No. 7-022311 that a carrier mobility can be improved by the method when compared with an amorphous Si, a laser annealing for the semiconductors other than the amorphous Si is not mentioned.

A laser light conventionally used for a laser annealing for such a crystallization (activation) of a semiconductor has been a laser light having a wavelength shorter than a wavelength causing a band edge absorption, such as an excimer laser, as described specifically in Y. Morita, et al., *Jpn. J Appl. Phys.,* Vol. 2, No. 2, (1989) pp. L309–L311. In the case of using a laser light having such a wavelength, electrons in the atoms constituting a semiconductor are excited and ionized by the energy of the laser light, and part of the energy of the electrons is converted into a lattice vibration of the atoms, transiently heating the semiconductor to a high temperature and thus promoting the crystallization (activation) of the semiconductor.

However, in such a prior art impurity activation by a laser annealing as described above, a laser apparatus with a relatively large output power is required since efficiency in energy utilization is low, and therefore the manufacturing cost tends to be increased. Furthermore, according to such a method, it is not easy to carry out the activation of impurity with high reliability and to produce semiconductor devices with desirable characteristics. In particular, the production of semiconductor devices with desirable characteristics is difficult in the activation of p-type impurities in the case of SiC.

DISCLOSURE OF THE INVENTION

In view of the foregoing drawbacks in prior art, it is an object of the present invention to provide a method and apparatus for activating a semiconductor impurity in which the activation of the impurity can be carried out with high efficiency and reliability even when a laser apparatus with a relatively small output power is used.

This and other objects are accomplished in accordance with the present invention by providing a method for activating a semiconductor impurity in a semiconductor comprising a major semiconductor element and an impurity element by irradiating the semiconductor with a light, the light having a longer wavelength than a wavelength causing a band edge absorption of the semiconductor. The light may be a light having such a wavelength that a resonance absorption is caused by a characteristic vibration in a bond of the major semiconductor element and the impurity element.

In the cases of prior art activation methods utilizing a light having a wavelength shorter than a wavelength causing a band edge absorption of a semiconductor, electrons in the atoms constituting the semiconductor are excited and ionized by the energy of the light, and part of the energy of the electrons is converted into the energy for a lattice vibration of the atoms. The semiconductor is thereby heated transiently to a high temperature, and thus the impurity is activated. On the other hand, the present inventors have found that, by irradiating a semiconductor with a light having a longer wavelength than a wavelength causing a band edge absorption of the semiconductor, a lattice vibration between the impurity element and the semiconductor element can be directly caused, and thereby the impurity can be activated. Therefore, according to the present invention, such advantageous effects are achieved that the efficiency in the activation is made to be excellent, that a laser apparatus with a small output power can be employed, and that a desirable impurity activation can be readily carried out.

More specifically, for example, in the cases where the major semiconductor element is silicon carbide and the impurity element is one of aluminum, boron, and gallium, a light having a wavelength of 9 $\mu$m to 11 $\mu$m, which is longer than a wavelength causing the band edge absorption (in the case of 6H—SiC, approximately 3 eV: up to 0.41 $\mu$m), may be employed, in order to readily produce a p-type silicon carbide semiconductor with desirable characteristics. In particular, in the case of aluminum, it is more preferable to employ a wavelength of 9.5 μm to 10 μm.

According to another aspect of the invention, in irradiating a semiconductor with a laser light having such a wavelength as described above, the laser light may be focused on a focal point adjacent to a surface of the semiconductor, and the focal point of the laser light may be made to be a point between a light source of the laser light and the surface of the semiconductor having a predetermined distance from the surface of the semiconductor. More specifically, in irradiating a semiconductor with a laser light having such a wavelength as described above, the laser irradiation may be carried out by detecting a plume caused in the case where the focal point of the laser light is brought to a position adjacent to the surface of the semiconductor from a direction of the light source of the laser light, and controlling the focal point of the laser light to be such a position that the plume starts to be detected.

By setting and controlling the focal point as described above, the degree of the activation is further improved easily.

BEST MODE FOR CARRYING OUT THE INVENTION

Now, with reference to the figures, there is described an example in which aluminum (Al) ions implanted into silicon carbide (SiC) as an impurity are activated.

Steps of Manufacturing a Semiconductor Substrate

First, referring to FIG. 1, an outline of fabrication steps of a semiconductor substrate, including a step of laser annealing, is detailed below.

(1) As shown in FIG. 1(a) and (b), an SiC thin film 2 composed of a single crystalline 6H—SiC (hexagonal silicon carbide) is epitaxially grown on a surface of an SiC substrate 1 composed of a single crystalline 6H—SiC by utilizing a sublimation method. The detail regarding methods and conditions for forming the SiC thin film 2 is not included herein, since known methods and conditions can be employed therefor. The SiC substrate 1 and the SiC thin film 2 are formed to be n-type by doping nitrogen (N) with a concentration of $10^{18}$ $cm^{-3}$ by adding a nitrogen gas ($N_2$) when growing the crystals. It is noted that the SiC substrate 1 and the SiC thin film 2 are not limited to the ones composed of 6H—SiC, and other crystal structures and other substrates such as the ones made of silicon may be likewise employed. In addition, not only the foregoing sublimation method, but also other methods such as a CVD method and the like may be employed in growing a single crystal to form the SiC thin film 2. The doping of N may be omitted depending on the types of semiconductor devices to be produced using the semiconductor formed according to the present invention.

Figure 2:
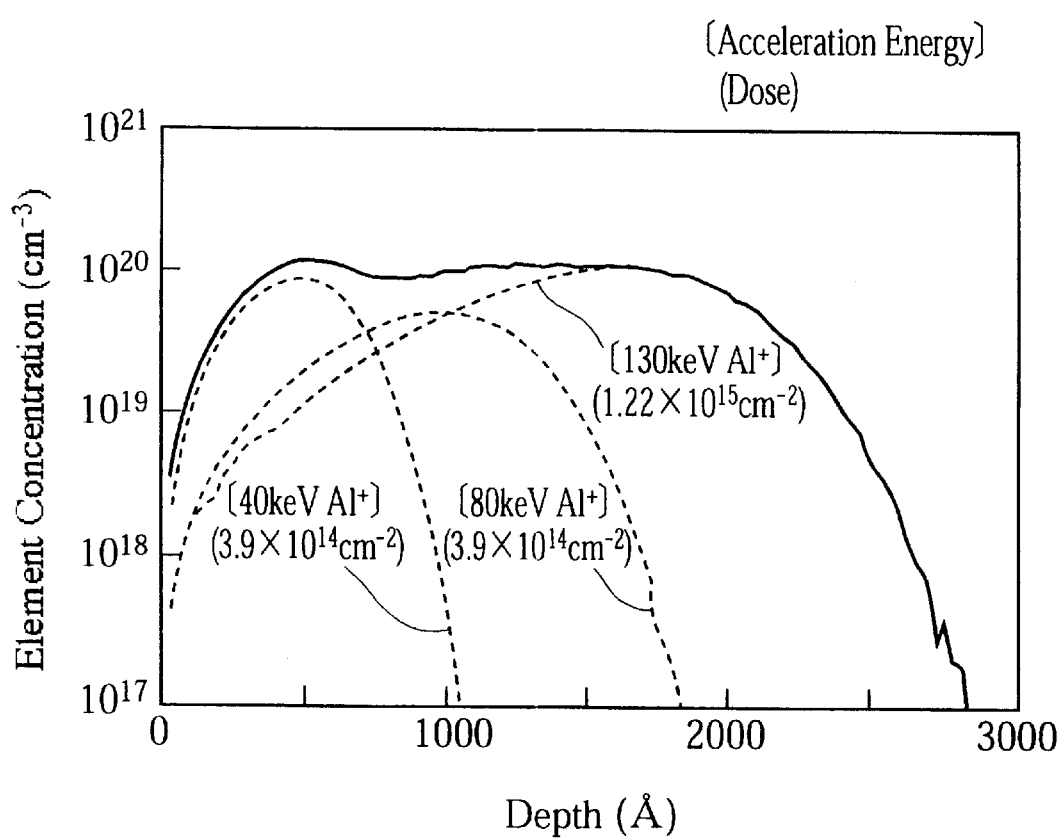
FIG. 2 is a graph showing a concentration of impurity ions in an impurity-doped semiconductor substrate in accordance with an embodiment of the present invention.

(2) As shown in FIG. 1(c), Al ions 3 are implanted into the SiC thin film 2 by ion implantation to form a p-type impurity-added layer (doped layer) 4 in the vicinity of a surface of the SiC thin film 2. The ion implantation is, more particularly, carried out at a temperature of 800° C. through the following three stages of:

(a) an acceleration energy of 130 keV and a dose of $1.22 \times 10^{15}$ $cm^{-2}$, (b) an acceleration energy of 80 keV and a dose of $3.9 \times 10^{14}$ $cm^{-2}$, and (c) an acceleration energy of 40 keV and a dose of $3.9 \times 10^{14}$ $cm^{-2}$, so as to form the impurity-added layer 4 in which a region with an Al concentration of $10^{20}$ $cm^{-3}$ is distributed down to a depth of approximately 2000 Å from the surface of the SiC thin film 2, as shown in FIG. 2.

For an impurity for forming the p-type impurity added layer 4, boron (B), gallium (Ga) and the like may be used other than Al. However, regarding the doping of an SiC thin film, it is preferable to use Al in the case of p-type with a low impurity level. In addition, it is also possible to form an n-type impurity added layer 4 by using phosphorus (P) and the like. In this case, Al and the like may be added when growing the crystals of the SiC substrate 1 and the SiC thin film 2 in place of adding N as described above. In addition, regarding such conditions of the ion implantation as a temperature at the implantation, an acceleration energy and a concentration in the implantation, and a selection of using whether one stage or multistages for implantation, such conditions may be determined depending upon the constructions, the thickness of the doped layer, and the like of the semiconductor devices to be produced using the semiconductor formed according to the present invention. A temperature in the implantation may be at room temperature, but it is more preferable to be at 500 ° C. or higher, since the impurity are thereby more activated easily in the subsequent laser annealing step. Naturally, other various known methods of ion implantation may be employed.

Figure 1:
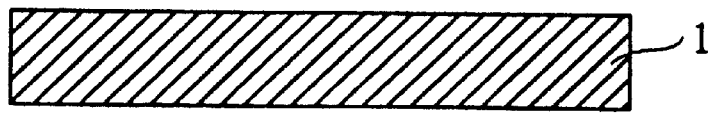
FIGS. 1(a)–(d) is a diagram showing the steps of producing a semiconductor substrate in accordance with an embodiment of the present invention.
Figure 1:
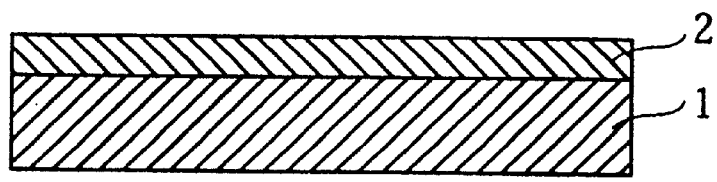
Figure 1:
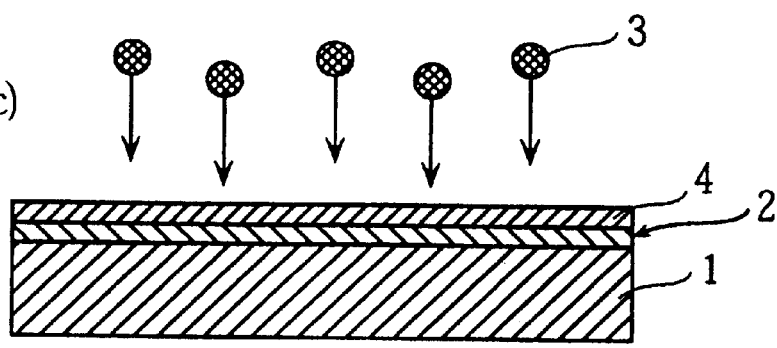
Figure 1:
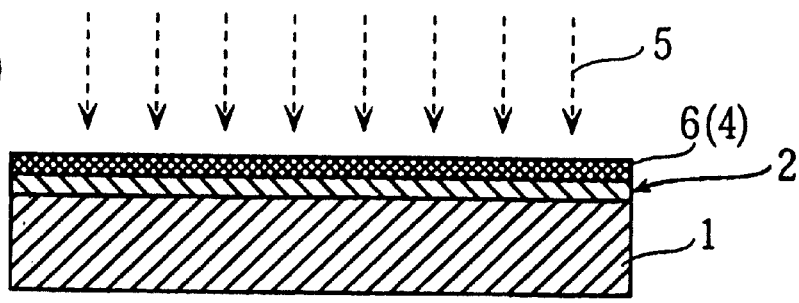

(3) As shown in FIG. 1 (d), the impurity added layer 4 is irradiated with a laser light 5 having a wavelength of the infrared radiation range scanning horizontally and vertically with a predetermined scanning frequency, so as to form an activated doped layer 6 in which the added impurity is evenly activated in the whole region. The detailed description regarding this activation is included in the following.

Laser Anneal System

Now, the description details a laser anneal system according to the present invention.

Figure 3:
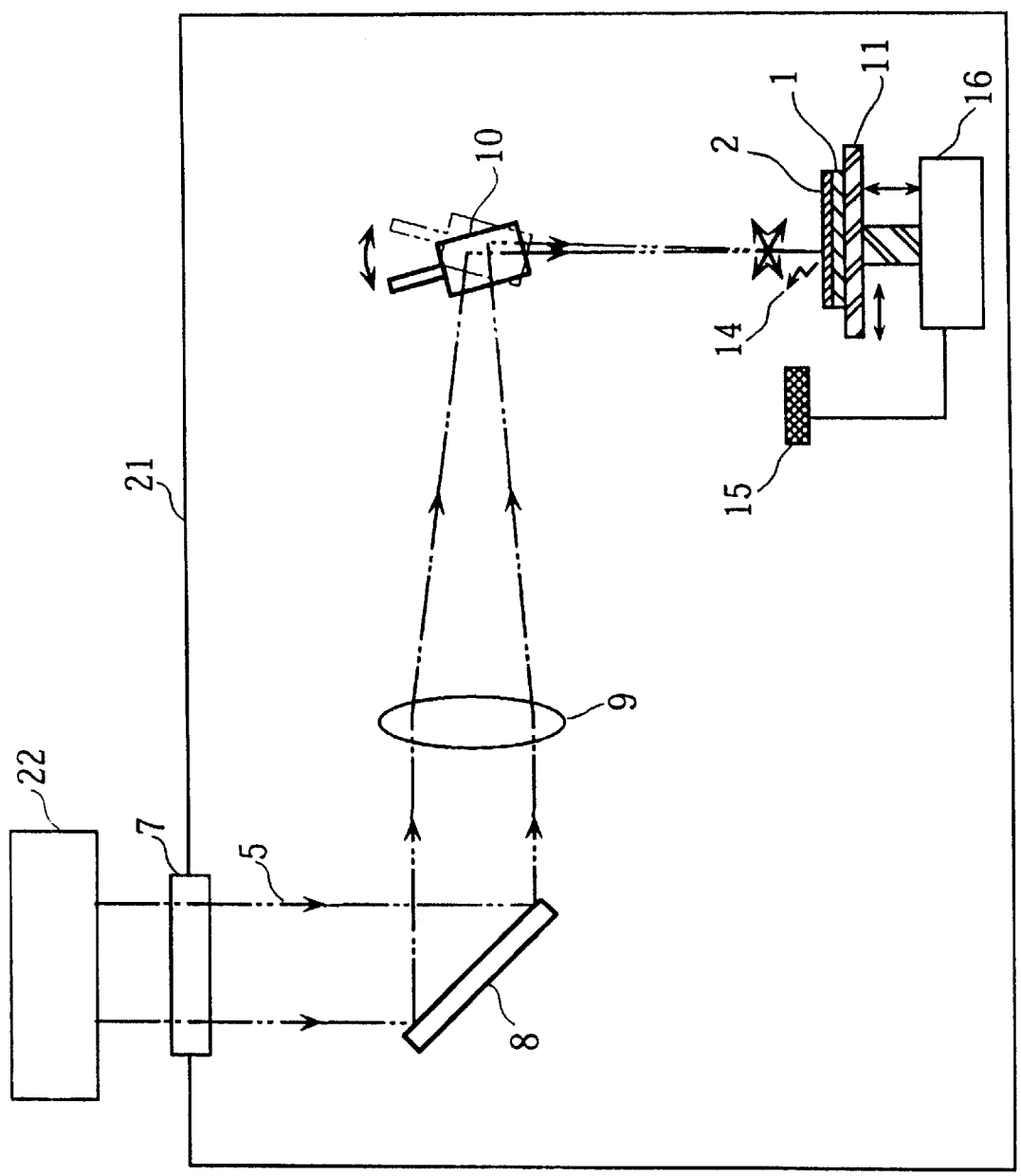
FIG. 3 is a diagram schematically showing a construction of a laser anneal system in accordance with an embodiment of the present invention.

As schematically shown in FIG. 3, the laser anneal system comprises a chamber 21 and a free-electron laser 22. In the chamber 21, an SiC substrate 1 in which an SiC thin film 2 is formed and Al is implanted (This substrate is hereinafter referred to as simply an "SiC substrate 1.") is to be disposed, and a wavelength of laser oscillation of the free-electron laser 22 is made to be variable. In the chamber 21, there are provided an optical window 7, a reflector mirror 8, a lens 9 for focusing and adjusting the laser light, a galvanometer mirror 10 for reflecting the laser light and scanning, and a sample table 11 for disposing the SiC substrate 1. The optical window 7, the reflector mirror 8, and the lens 9 are made from, for example, ZnSe. The sample table 11 has such a construction that the SiC substrate 1 can be moved in a vertical direction and horizontal direction in FIG. 3 by means of a sample table moving mechanism 16 provided with a piezoelectric actuator or a stepping motor and the like (not shown). In the vicinity of the sample table 11, a light detector 15 for detecting a spark-like light emission (plume) 14, which is generated from the surface of the SiC substrate by a laser light irradiation, is provided, and according to the result of the detection, the movement of the sample table moving mechanism 16 is controlled to move the sample table 11 in the upward or downward direction.

Detail of Laser Annealing Treatment

Now, a laser annealing treatment utilizing the foregoing laser anneal system is detailed below.

In accordance with this laser annealing treatment, a position of a focal point of the laser light 5 and a wavelength of the laser light 5 are appropriately set in order to achieve a desirable impurity activation.

Figure 4:
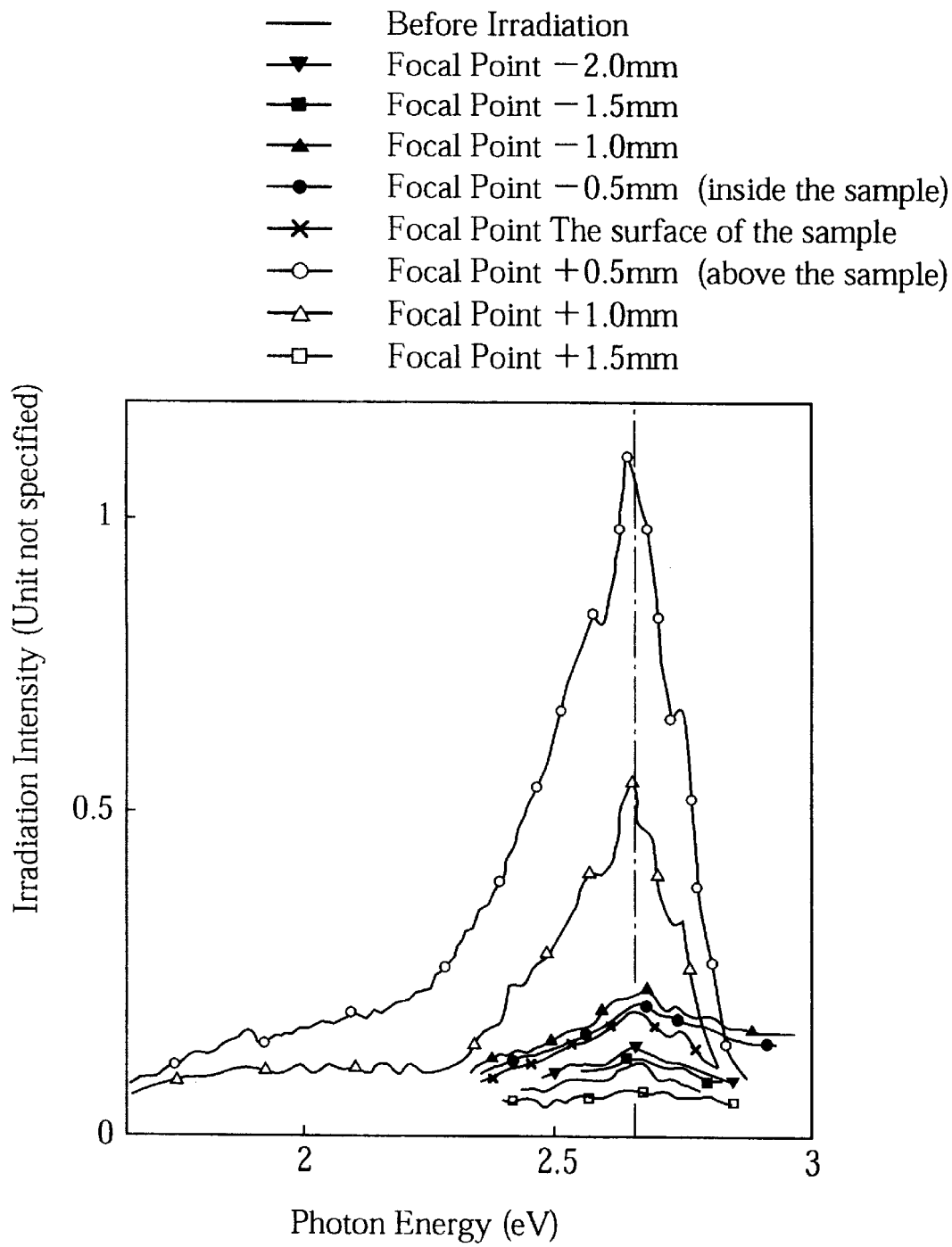
FIG. 4 is a graph showing a dependence on a focal point of a photoluminescence spectrum of an SiC film in a semiconductor substrate laser-annealed in accordance with an embodiment of the present invention.

Firstly, an adjustment of the focal point is detailed. The wavelength of the laser light 5 was set at 10.2 $\mu$m, and the focal point of the laser light 5 was set at various positions ranging from 1.5 mm upward to −2.0 mm inward (a backside of the SiC substrate 1) with respect to the surface of the SiC substrate 1, to carry out the impurity activation. Regarding each of the resulting SiC substrates 1, in order to confirm the degree of impurity activation, a measurement of photoluminescence spectrum was carried out with a subjected sample temperature of 8 K (−265° C.) with the use of He—Cd laser (wavelength: 325 nm) as an exciter light. The results of the measurement are shown in FIG. 4. It is noted that, in FIG. 4, a light emission observed in the vicinity of approximately 2.6 eV (wavelength: 480 nm) is a photoluminescence by the recombination of donor (D)—acceptor (A) pair (DA pair light emission) resulting from the activated impurity elements in the SiC substrate 1, and that the more the activated impurity is, the larger the intensity of the DA pair light emission becomes. As seen from the results, when the focal point of the laser light 5 is slightly (0.5 mm to 1.0 mm) above the surface of the SiC substrate 1 (represented by the plots ○ and Δ in FIG. 4), the strongest DA pair light emission is observed, and it proves that the impurity activation is most efficiently carried out under such conditions. On the other hand, when the focal point is set inwardly with respect to the surface of the SiC substrate 1 (represented by the plots ●, ▲, ■, and ▼ in FIG. 4), the intensity of the DA pair light emission is rendered small. When the focal point is slightly inside the surface of the SiC substrate 1 (represented by the plots ● and ▲ in FIG.4), the surface of the SiC substrate 1 was blackened, and it is considered that the surface of the SiC substrate 1 was modified or deteriorated. From the foregoing, it is concluded that a desirable activation can be achieved by making the focal point of the laser light 5 slightly above the surface of the SiC substrate 1.

Such control of the focal point can be carried out, for example, according to the following manner. That is, the state of the focal point of the laser light 5 being slightly above the surface of the substrate 1 corresponds to the state in which the plume 14 starts to be generated by the irradiation of the laser light 5. Therefore, by detecting the occurrence of the plume 14 with the light detector 15 and accordingly carrying out a feedback control so that the state of the plume starting to be generated is maintained by moving the SiC substrate 1 with the sample table moving mechanism 16, the irradiated surface is controlled to be placed in the most suitable position to achieve a desirable activation. In order to prevent the modification or deterioration of the SiC substrate 1 caused by the irradiation of the laser light 5, it is preferable that the focal point be at first set at a position away from the surface of the SiC substrate 1 and thereafter be brought close to the SiC substrate 1.

It is to be noted that a method of controlling the focal point is not limited to such a method as described above. For example, the control may be carried out by detecting the position of the surface of the SiC substrate 1 by means of a position sensor. In addition, when the distance between the focal point and the surface of the SiC substrate can be maintained constantly, the position of the sample table 11 may be determined in advance and need not to be controlled during the laser annealing.

In addition, by controlling the focal point in such a manner as described above, an intensity of laser light irradiation to the SiC substrate 1 and the like can be readily controlled. However, the intensity of the laser light irradiation may be controlled by modulating the laser light based on the results of the detection of the plume and the like method.

Figure 5:
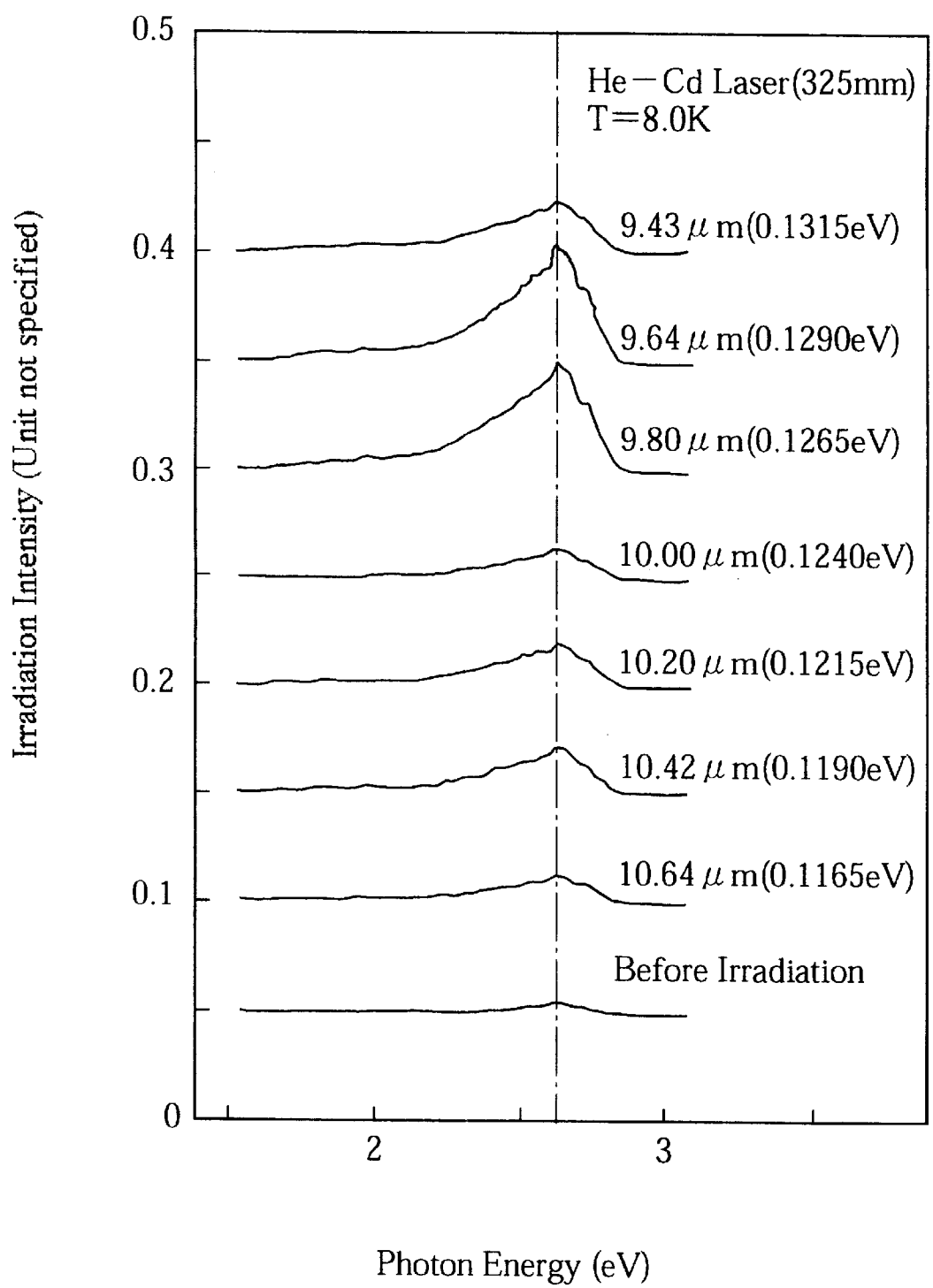
FIG. 5 a graph showing a dependence on a laser light wavelength of a photoluminescence spectrum of an SiC film in a semiconductor substrate laser-annealed in accordance with an embodiment of the present invention.

Secondly, control of the wave length of the laser light 5 is detailed. A wavelength of the laser light 5 was set at various wavelengths ranging from 10.64 $\mu$m to 9.43 $\mu$m, to carry out the impurity activation, and a photoluminescence spectrum was measured regarding each of the resulting SiC substrates 1 in the same manner as in the above example where the focal point was varied. The results of the measurement are shown in FIG. 5. (It is to be noted that, in FIG. 5, for the sake of clarity, an interval of 0.05 scale in the direction of the y-axis is placed between each spectrum corresponding to each of the wavelengths.) As apparent from FIG. 5, when the wavelength of the laser light 5 is in the range of 9–11 $\mu$m, more particularly in the range of 9.5–10 $\mu$m, the intensity of the DA pair light emission is high, and therefore the effect of the activation by Al is large.

In the case of SiC, the absorption wavelengths corresponding to TO phonon and LO phonon in lattice vibration of Si—C are 12.6 $\mu$m and 10.3 $\mu$m respectively, and the absorption wavelength of Si—N is 11.9 $\mu$m. However, as shown in FIG. 4, the maximum DA pair light emission was obtained in the cases of the laser light with a wavelength of 9.8–9.6 vm. Therefore, it is considered that an absorption in the bond of Si and the impurity element Al, or C and the impurity element Al, has a great influence on the activation of Al.

In prior art activation methods, a light such as an excimer laser, which has a shorter wavelength than a wavelength that causes a band edge absorption in SiC (in the case of 6H—SiC, approximately 3 eV: up to 0.41 $\mu$m), has been employed in order to provide energy to the electron system in the subjected semiconductor. In contrast, a method in accordance with the present invention employs a light having a longer wavelength than the wavelength that causes the band edge absorption, particularly, a light having such a wave length that an absorption for a bond of an impurity element and an element composing a semiconductor is caused. By employing such a light, activation by directly exciting the lattice vibration between an impurity element and an element constituting a semiconductor is made possible, and therefore such advantageous effects are achieved that the degree of an activation can be readily improved with high efficiency and that a laser system with a small output power can be employed.

It is noted that the above values are the examples in the case of employing SiC and Al, and when other impurity elements and other constituent elements for a semiconductor are employed, a light having a wavelength based on the theory as described above may be used depending upon the compositions.

Further, the above-described example may include such steps as a step of enclosing an inert gas such as argon (Ar) and the like in the chamber 21 and thereafter carrying out the laser annealing in such atmosphere, a step of heating the SiC substrate 1 to a temperature of approximately 1000 ° C. or lower, and a step of cooling the SiC substrate 1. It is preferable to add such steps to the above example in that the effects of the invention are further increased, and the controllability is further improved.

It is also noted that the semiconductor material herein is not limited to SiC. Si and the like may be employed. The material is not limited to a single crystal material, and the same effects are also attained in the case of employing amorphous semiconductor materials and the like.

Although a free-electron laser is used in the above example in order to make a comparison in various wavelengths, a laser system with a fixed wavelength may be used insofar as a predetermined wavelength as described above is obtained. In particular, since a relatively long wavelength is utilized, the productivity can be readily increased by using a $CO_2$ laser and the like.

Semiconductor Device

Now, there is explained an example of an SiC diode utilizing the SiC in which impurity ions are implanted and activated in the same manner as in the above example.

Figure 6:
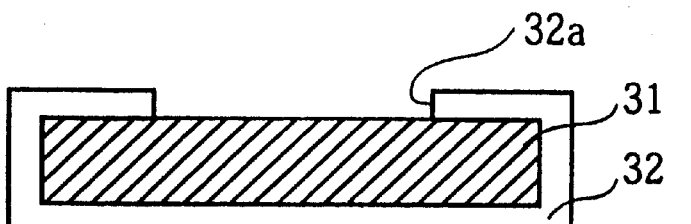
FIGS. 6(a)–6(f) is a diagram showing the steps of manufacturing an SiC diode accordance with an embodiment of the present invention.
Figure 6:
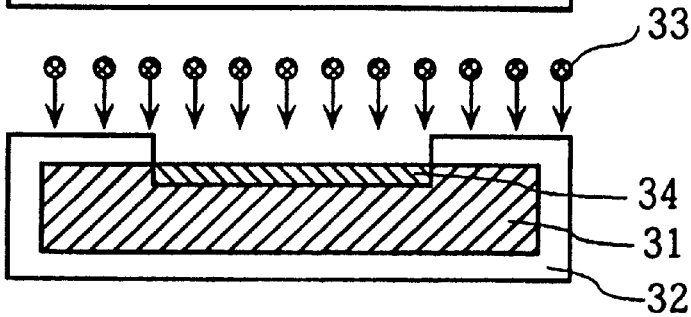
Figure 6:
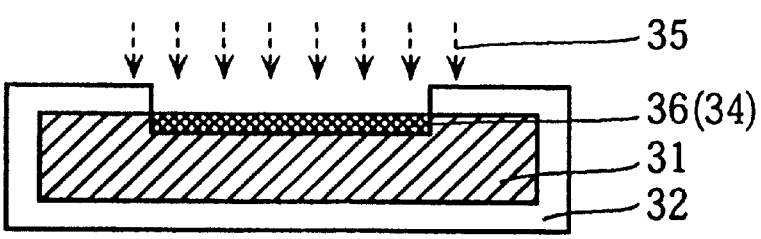
Figure 6:
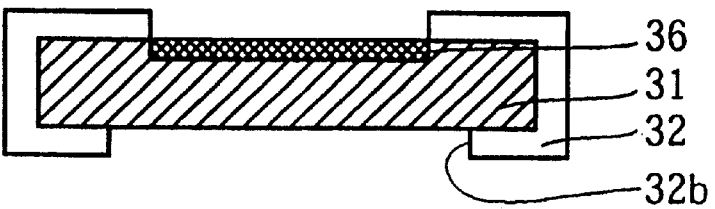
Figure 6:
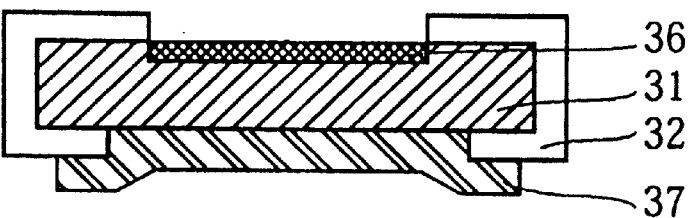
Figure 6:
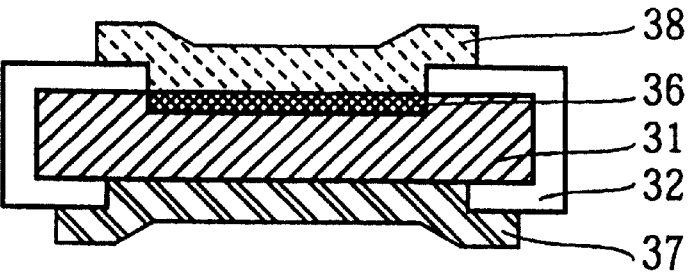

FIG. 6 shows a schematic diagram of the steps of producing an SiC diode according to a method of doping impurities in accordance with the present invention.

(1) As shown in FIG. 6(a), an insulation layer (oxide layer) 32 is formed on the whole surface of an n-type SiC substrate 31 by a thermal oxidation, CVD, sputtering, and the like method, and thereafter an aperture 32a is formed by a photolithography and etching. For the insulation layer 32, an oxide layer, a nitride layer, or a combination layer of an oxide layer and a nitride layer may be used. The insulation layer 32 may be omitted depending upon the construction of the devices to be produced.

(2) As shown in FIG. 6(b), using the insulation layer 32 as a mask, Al ions 33 are selectively implanted, and an Al implanted layer 34 is thereby formed.

(3) As shown in FIG. 6(c), by irradiating a laser light 35 having a wavelength of 9.8 μm, a p-type doped layer 36 in which the impurity is activated is formed.

(4) As shown in FIG. 6(d), an aperture 32b is formed on the back surface of the insulation layer 32. Thereafter, as shown in FIG. 6(e), a nickel (Ni) layer is deposited, and an n-type ohmic electrode 37 is formed by etching and heating treatment.

(5) As shown in FIG. 6(f), an Al layer is deposited over the surface on which the p-type doped layer 36 is formed, and thereafter an ohmic electrode 38 is formed by etching and heat treatment.

Figure 7:
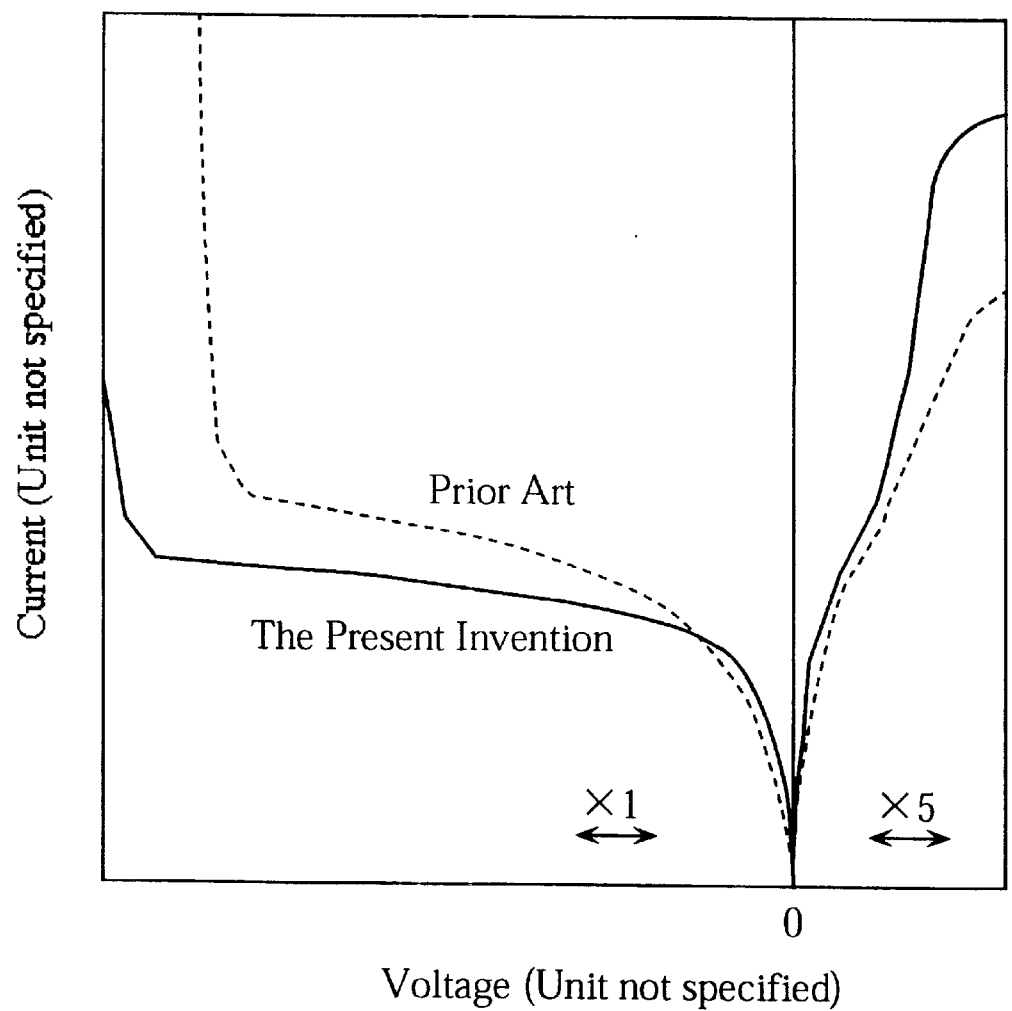
FIG. 7 is a graph showing electrical characteristics of an SiC diode accordance with an embodiment of the present invention.

FIG. 7 shows the characteristics of a diode made in accordance with the foregoing steps. The dashed line in the same figure shows the characteristics of a prior art diode made by an impurity activation by a heat treatment at 1500° C., as explained in the background art herein. As shown in FIG. 7, it is understood that, according to the present invention, an advantageous diode having an excellent breakdown voltage characteristic and the like characteristics is achieved without such a high temperature heat treatment at 1000° C. or higher.

Although an example of forming a diode is explained herein, various devices such as transistors and FETs (field-effect transistors) can be produced by the same doping (activation) method as described above, for example, with appropriately selecting device constructions and masks.

INDUSTRIAL APPLICABILITY

The present invention can be realized according to the examples described thus far, and exhibits advantages as described below.

Specifically, by utilizing a light having a wavelength longer than a wavelength by which a band edge absorption is caused in the semiconductor, and more specifically a light having approximately a wavelength by which a resonance absorption is caused by the characteristic vibration in the bond of the impurity element and the elements constituting the semiconductor, it is made possible to carry out an impurity activation with a high efficiency and high reliability, even when a laser device with a relatively small output power is employed. In particular, an activation of a p-type impurity in SiC, which has been difficult, can be carried out with an extremely high efficiency.

Accordingly, the present invention is useful, since it is applicable to such fields as fabrication of semiconductor devices and the like.

What is claimed is:

1. A method of activating a semiconductor impurity by irradiating a semiconductor comprising a major semiconductor element and an impurity element with a light to activate the impurity element, wherein:

said major semiconductor element is silicon carbide;

said impurity element is a member selected from the group consisting of aluminum, boron, and gallium;

said light has a wavelength that is longer than a wavelength causing a band edge absorption of the semiconductor said wavelength is such that a resonance absorption is; caused by a characteristic vibration in a bond of said major semiconductor element and said impurity element; and by using said light,said impurity element is activated by selectively vibrating a bond between said impurity element and said major semiconductor element in said semiconductor.

2. A method of activating a semiconductor impurity according to claim 1, in which said semiconductor is formed by implanting said impurity element in a thin film comprising said major semiconductor element or in a substrate comprising said major semiconductor element.

3. A method of activating a semiconductor impurity according to claim 1, in which said light has a wavelength longer then 9.43 μm and shorter than 10.00 μm.

4. A method of activating a semiconductor impurity according to claim 2, in which said light has a wavelength longer than 9.43 μm and shorter than 10.00 μm.

5. A method of activating a semiconductor impurity according to claim 1, in which said light is a laser light.

6. A method of activating a semiconductor impurity according to claim 5, in which:
said laser light is focused on a focal point adjacent to a surface of the semiconductor, and
said impurity element in a predetermined region in the semiconductor is activated by scanning the semiconductor with the laser light.

7. A method of activating a semiconductor impurity according to claim 5, in which:
said laser light is focused on a focal point adjacent to a surface of the semiconductor, and
an irradiation intensity of the laser light is controlled by controlling a distance between the focal point and the surface of the semiconductor.

8. A method of activating a semiconductor impurity according to claim 5, in which:
said laser light is focused on a focal point adjacent to a surface of the semiconductor, and
an irradiation of the laser light is so controlled that the focal point of the laser light is a position between a light source of the laser light and the surface of the semiconductor, the position having a predetermined distance from the surface of the semiconductor.

9. A method of activating a semiconductor impurity according to claim 1, in which only a predetermined region in the semiconductor is selectively irradiated with said light by using a member for masking.

10. A method of activating a semiconductor impurity by irradiating a semiconductor comprising a major semiconductor element and an impurity element with a laser light to activate the impurity element, said laser light having a wavelength longer than a wavelength causing a band edge absorption of the semiconductor, said method including
focusing said laser light on a focal point adjacent to a surface of said semiconductor,
carrying out irradiation of the laser light by detecting a plume caused in the case where an irradiation intensity of the laser light is increased, and
controlling the irradiation intensity to be approximately such an intensity that the plume starts to be detected.

11. A method of activating a semiconductor impurity by irradiating a semiconductor comprising a major semiconductor element and an impurity element with a laser light to activate the impurity element, said laser light having a wavelength longer than a wavelength causing a band edge absorption of the semiconductor, said method including
focusing said laser light on a focal point adjacent to a surface of said semiconductor,
carrying out irradiation of the laser light by detecting a plume caused in the case where an irradiation intensity of the laser light is increased, and
controlling said laser light to be focused on approximately such a position that the plume starts to be detected.

* * * * *